(12) United States Patent
Furutani et al.

(10) Patent No.: US 11,251,808 B2
(45) Date of Patent: Feb. 15, 2022

(54) IMAGE DECODING DEVICE

(71) Applicant: SHIKINO HIGH-TECH CO., LTD., Uozu (JP)

(72) Inventors: Koichi Furutani, Osaka (JP); Shingo Shibata, Osaka (JP)

(73) Assignee: SHIKINO HIGH-TECH CO., LTD., Uozu (JP)

( * ) Notice: Subject to any disclaimer, the term of this patent is extended or adjusted under 35 U.S.C. 154(b) by 234 days.

(21) Appl. No.: 16/489,237

(22) PCT Filed: Jan. 10, 2018

(86) PCT No.: PCT/JP2018/000260
§ 371 (c)(1),
(2) Date: Aug. 27, 2019

(87) PCT Pub. No.: WO2018/159105
PCT Pub. Date: Sep. 7, 2018

(65) Prior Publication Data
US 2020/0014400 A1     Jan. 9, 2020

(30) Foreign Application Priority Data

Feb. 28, 2017   (JP) .............................. JP2017-035769

(51) Int. Cl.
*H03M 7/40* (2006.01)
*H04N 19/42* (2014.01)
(Continued)

(52) U.S. Cl.
CPC .............. *H03M 7/40* (2013.01); *H03M 7/46* (2013.01); *H04N 19/42* (2014.11); *H04N 19/91* (2014.11)

(58) Field of Classification Search
CPC ........ H03M 7/40; H03M 7/46; H03M 7/6005; H03M 7/425; H04N 19/42; H04N 19/91; H04N 1/41
See application file for complete search history.

(56) References Cited

U.S. PATENT DOCUMENTS 5,606,421 A * 2/1997 Suzuki .................. H03M 7/425
360/901
6,961,474 B1 * 11/2005 Hirano .................. H04N 19/61
341/67

(Continued)

FOREIGN PATENT DOCUMENTS

JP   H07-99579 A   4/1995
JP   2002-237754 A   8/2002

(Continued)

OTHER PUBLICATIONS

Feb. 20, 2018 Search Report issued in International Patent Application No. PCT/JP2018/000260.

*Primary Examiner* — Tracy Y. Li
(74) *Attorney, Agent, or Firm* — Oliff PLC

(57) ABSTRACT

An input control unit collectively sends a plurality of pieces of variable length code data. A primary analysis processing unit processes a first piece of variable length code data, recognizes zero run information, group number information, and overhead bit information relating thereto, and outputs them to a frequency conversion unit. A continuous analysis processing unit processes one or more pieces of variable length code data subsequent to the first piece of variable length code data. In the case of variable length code data targeted for a predetermined process, the continuous analysis processing unit recognizes zero run information, group number information, and overhead bit information relating thereto, and output them to the frequency conversion unit. In the case of not the variable length code data targeted for the (Continued)

predetermined process, the continuous analysis processing unit discards this and subsequent pieces of data.

1 Claim, 11 Drawing Sheets

(51) Int. Cl.
*H04N 19/91* (2014.01)
*H03M 7/46* (2006.01)

(56) References Cited

U.S. PATENT DOCUMENTS

| | | | |
|---|---|---|---|
| 2002/0154042 A1 | 10/2002 | Igarashi et al. | |
| 2007/0217704 A1* | 9/2007 | Zeng | H04N 19/91 |
| | | | 382/244 |

FOREIGN PATENT DOCUMENTS

| | | |
|---|---|---|
| JP | 2004-179752 A | 6/2004 |
| JP | 2011-114525 A | 6/2011 |

\* cited by examiner

FIG.4

| | NUMBER OF ZERO RUNS (Z)/ GROUP (G) NUMBER | MAXIMUM GROUP NUMBER | MAXIMUM CODE LENGTH | NUMBER OF COMBINATIONS | TOTAL CODE LENGTH (MAXIMUM CODE + ADDITIONAL BIT) |
|---|---|---|---|---|---|
| PRIMARY ANALYSIS PROCESSING UNIT DC COEFFICIENT | · G NUMBER 0~B | B | 16bit | 12 | 27bit |
| PRIMARY ANALYSIS PROCESSING UNIT AC COEFFICIENT | · Z0~F/G NUMBER 1~A · Z0/G0 · ZF/G0 | A | 16bit | 162 | 26bit |
| SECONDARY ANALYSIS PROCESSING UNIT AC COEFFICIENT | · Z0/G NUMBER 0~7 · Z1/G NUMBER 1~3 · Z2/G NUMBER 1~2 · Z3/G NUMBER 1~2 · Z4/G NUMBER 1 · Z5/G NUMBER 1 · Z6/G NUMBER 1 · Z7/G NUMBER 1 | 7 | 9bit | 19 | 16bit |
| TERTIARY ANALYSIS PROCESSING UNIT AC COEFFICIENT | · Z0/G NUMBER 0~7 · Z1/G NUMBER 1~2 · Z2/G NUMBER 1 · Z3/G NUMBER 1 · Z4/G NUMBER 1 | 7 | 9bit | 13 | 16bit |
| QUATERNARY ANALYSIS PROCESSING UNIT AC COEFFICIENT | · Z0/G NUMBER 0~7 · Z1/G NUMBER 1~2 · Z2/G NUMBER 1 | 7 | 9bit | 11 | 16bit |
| TOTAL | | | | 217 | 101bit |

FIG.5

| RRRR \ SSSS | GROUP NUMBER | | | | | | | | | | |
|---|---|---|---|---|---|---|---|---|---|---|---|
| | 0 | 1 | 2 | 3 | 4 | 5 | 6 | 7 | 8 | 9 | A |
| 0 | 4602 | 36894 | 28768 | 21716 | 16120 | 10985 | 5420 | 2014 | 472 | 8 | 0 |
| 1 | - | 10261 | 4007 | 1595 | 621 | 236 | 72 | 12 | 1 | 1 | 0 |
| 2 | - | 4156 | 921 | 220 | 48 | 9 | 4 | 0 | 0 | 0 | 0 |
| 3 | - | 2239 | 351 | 53 | 12 | 0 | 0 | 0 | 0 | 0 | 0 |
| 4 | - | 1355 | 176 | 20 | 1 | 1 | 0 | 0 | 0 | 0 | 0 |
| 5 | - | 941 | 104 | 12 | 0 | 0 | 1 | 0 | 0 | 0 | 0 |
| 6 | - | 690 | 77 | 10 | 0 | 0 | 0 | 0 | 0 | 0 | 0 |
| 7 | - | 442 | 41 | 5 | 1 | 0 | 0 | 0 | 0 | 0 | 0 |
| 8 | - | 322 | 25 | 1 | 0 | 0 | 0 | 0 | 0 | 0 | 0 |
| 9 | - | 230 | 17 | 1 | 0 | 0 | 0 | 0 | 0 | 0 | 0 |
| A | - | 127 | 12 | 0 | 0 | 0 | 0 | 0 | 0 | 0 | 0 |
| B | - | 93 | 12 | 1 | 0 | 0 | 0 | 0 | 0 | 0 | 0 |
| C | - | 65 | 12 | 2 | 0 | 0 | 0 | 0 | 0 | 0 | 0 |
| D | - | 36 | 1 | 0 | 0 | 0 | 0 | 0 | 0 | 0 | 0 |
| E | - | 19 | 0 | 0 | 0 | 0 | 0 | 0 | 0 | 0 | 0 |
| F | 13 | 6 | 0 | 0 | 0 | 0 | 0 | 0 | 0 | 0 | 0 |

NUMBER OF ZERO RUNS

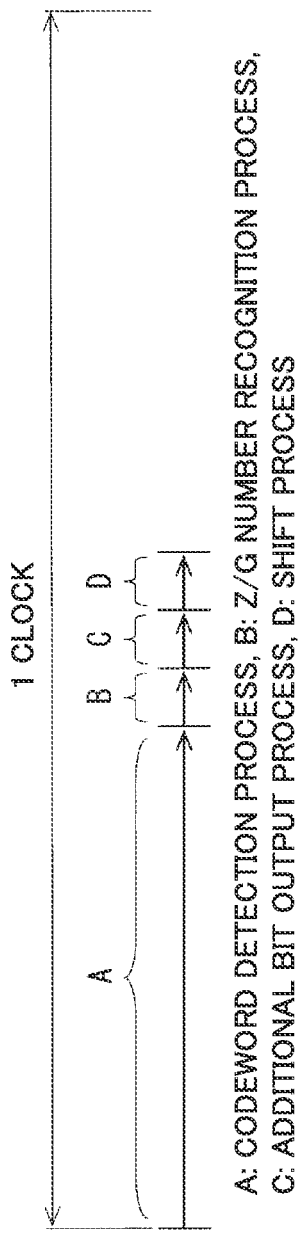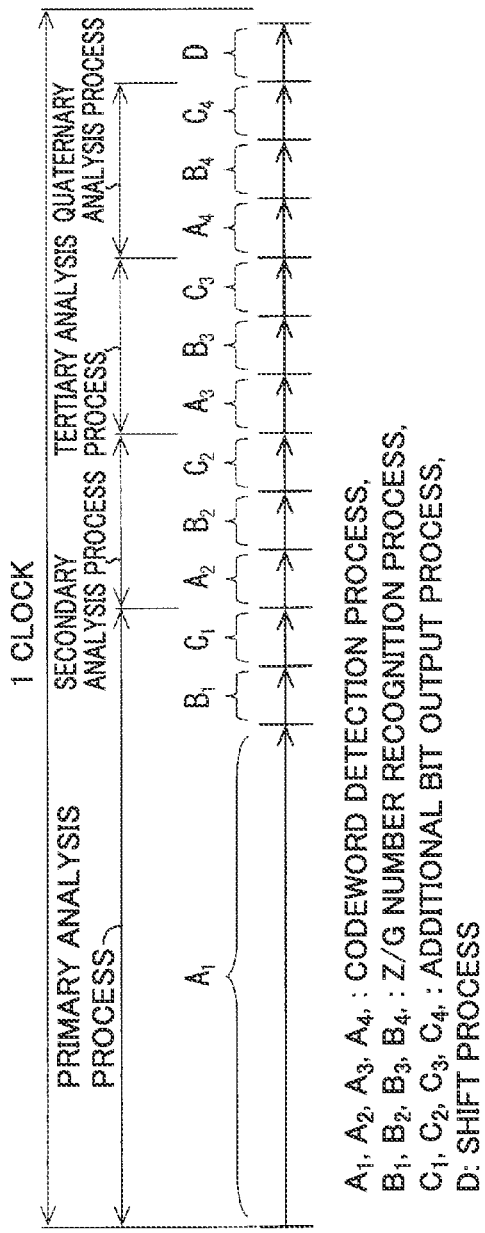

FIG.11

| | NUMBER OF ZERO RUNS (Z)/ GROUP (G) NUMBER | MAXIMUM GROUP NUMBER | MAXIMUM CODE LENGTH | NUMBER OF COMBINATIONS | TOTAL CODE LENGTH (MAXIMUM CODE + ADDITIONAL BIT) |
|---|---|---|---|---|---|
| DC COEFFICIENT | • G NUMBER 0-B | B | 16bit | 12 | 27bit |
| AC COEFFICIENT | • Z0~F/G NUMBER 1-A • Z0/G0 <br> • ZF/G0 | A | 16bit | 162 | 26bit |
| TOTAL | | | | 174 | 53bit |

IMAGE DECODING DEVICE

TECHNICAL FIELD

The present invention relates to an image decoding device configured to decode image data (encoded data) compressed using a Huffman code.

BACKGROUND ART

Conventionally, in a field handling images such as photographs, an image encoding device and an image decoding device have been used. The image encoding device is configured to compress and encode image data, which is original data, in accordance with the JPEG (Joint Photographic Experts Group) standard in order to reduce a load or the like in communication. The image decoding device is configured to expand the encoded compressed image data to reconstruct the original image.

Generally, the image encoding device includes a DCT unit, a quantization unit, a zigzag scan unit, and a Huffman encoding unit. The DCT unit performs the following process: image data, converted from RGB color data to YUV luminance color difference data, is divided into blocks each having 8×8 pixels; and for each divided block, image data corresponding to each pixel is converted into a frequency component (referred to as DCT (Discrete Cosine Transform) coefficient) so as to generate coefficient data including one DC (Direct Current) coefficient and 63 AC (Alternating Current) coefficients.

The quantization unit performs a quantization process by dividing each of the 8×8 coefficient data (numerical values), which have been generated for the respective blocks by the DCT unit, by a corresponding numerical value in a quantization table (8×8 numerical values) prepared in advance. The zigzag scan unit performs a process to generate 64 pieces of coefficient data arranged in a straight line (that is, arrayed one-dimensionally) by scanning the 8×8 pieces of coefficient data, which have been quantized by the quantization unit for each block, in a zigzag manner from the DC coefficient across the AC coefficients. The Huffman encoding unit performs a process to generate and output encoded data obtained by encoding, using a Huffman code, the coefficient data one-dimensionally arrayed by the zigzag scan unit for each block.

FIG. 7 shows a data structure of general encoded data (JPEG stream) generated by the image encoding device. As shown in FIG. 7, this encoded data has a structure in which a front marker group, encoded compressed image data, and an EOI (End Of Image) marker are arranged sequentially. The front marker group is constituted of various types of markers. The EOI marker defines the end of the encoded data.

The front marker group includes: a SOI (Start Of Image) marker that defines the head of the encoded data; a DQT (Define Quantization Table) marker that defines the quantization table; a SOF (Start Of Frame) marker that defines the start of a frame and defines an image size; a DHT (Define Huffman Table) marker that defines the Huffman code table; and a SOS (Start Of Scan) marker that defines that compressed image data exists subsequent to the SOS marker.

Moreover, the compressed image data is represented by representing the coefficient data for each block by a Huffman code and a variable length code subsequent thereto. The Huffman code encodes zero run information and group number information. The variable length code has an additional bit handled as a unit. The additional bit represents a coefficient value. The compressed image has such a structure that the variable length code data are connected continuously.

On the other hand, as shown in FIG. 8, image decoding device 100 includes a Huffman decoding unit 110, a reverse zigzag scan unit 130, an dequantization unit 140, and an IDCT unit 150 (see Patent Literature 1 described below). Generally, as shown in FIG. 9, Huffman decoding unit 110 includes a code input unit 111, an internal buffer 112, a front marker analysis unit 113, a final marker analysis unit 114, a code analysis unit 115, and a frequency conversion unit 125.

Code input unit 111 performs a process to receive the encoded data from outside and store it into internal buffer 112. The encoded data is sent from internal buffer 112 to each of front marker analysis unit 113, final marker analysis unit 114, and code analysis unit 115. Front marker analysis unit 113 extracts the front marker group included in the encoded data and sends the extracted front marker group to reverse zigzag scan unit 130. Final marker analysis unit 114 performs a process to detect the EOI marker in the encoded data sent from internal buffer 112, and send a resulting detection signal to reverse zigzag scan unit 130.

As shown in FIG. 10, code analysis unit 115 is constituted of an input control unit 116, a codeword detection unit 117, a number-of-zero-runs/group number recognition unit 118, and an additional bit output unit 119.

Input control unit 116 controls sending of the encoded data received from internal buffer 112. Specifically, input control unit 116 sequentially sends data relating to the markers. For pieces of variable length code data subsequent to the SOS marker, input control unit 116 sends an amount of data slightly exceeding the maximum amount of data that a piece of variable length code data, which is handled as a unit, can have. Input control unit 116 sends, to internal buffer 112, a shift signal corresponding to the bit length of the piece of variable length code data processed by codeword detection unit 117, number-of-zero-runs/group number recognition unit 118, and additional bit output unit 119.

Accordingly, in internal buffer 112, the data (processed piece of variable length code data) corresponding to the bit length corresponding to the received shift signal is deleted from the forefront of the stored data and the next piece of variable length code data is shifted to the forefront side, thereby bringing the next piece of variable length code data to the forefront. It should be noted that internal buffer 112 has a sufficient storage capacity to store a plurality of pieces of variable length code data. When the processed piece of variable length code data is deleted and the next piece of variable length code data is brought to the forefront, internal buffer 112 sequentially receives, from outside, subsequent encoded data under control of code input unit 111.

Codeword detection unit 117 performs a process to: recognize (detect) data relating to a codeword, i.e., Huffman code for each piece of variable length code data based on the Huffman code table recognized from the DHT marker of the received front marker group; and send the recognized Huffman code data and the piece of variable length code data to number-of-zero-runs/group number recognition unit 118.

Based on the Huffman code data detected by codeword detection unit 117, number-of-zero-runs/group number recognition unit 118 recognizes the number of zero runs and group number defined by the Huffman code, and outputs the recognized number of zero runs, the recognized group number, and the variable length code data to additional bit output unit 119.

Additional bit output unit 119 performs a process to: recognize the additional bit length corresponding to the group number, based on the data relating to the group number received from number-of-zero-runs/group number recognition unit 118; and based on the received variable length code data, recognize, as the additional bit, the data subsequent to the Huffman code data and corresponding to the additional bit length; and output, to frequency conversion unit 125, the data relating to the number of zero runs and the data corresponding to the recognized additional bit.

Additional bit output unit 119 sends, to input control unit 116, a signal relating to a bit length obtained by adding the additional bit length to the bit length of the processed variable length code data, i.e., the bit length of the Huffman code detected by codeword detection unit 117. Input control unit 116 sends, to internal buffer 112, the shift signal relating to the bit length of the variable length code data as described above.

Frequency conversion unit 125 reconstructs, for each block, the one-dimensional array of quantized coefficient data (DCT coefficient data) based on the data relating to the number of zero runs and the additional bit both sent from code analysis unit 115, and outputs it to reverse zigzag scan unit 130.

Thus, in this Huffman decoding unit 110, the marker information of the front marker group included in the encoded data is analyzed by marker analysis unit 113 and is sent to reverse zigzag scan unit 130. Then, the one-dimensional array of coefficient data is reconstructed from the compressed image data for each block by code analysis unit 115 and frequency conversion unit 125, and is sent to reverse zigzag scan unit 130. When the whole of the encoded data is processed and the EOI marker is detected by final marker analysis unit 114, the marker information of the EOI marker is sent from final marker analysis unit 114 to reverse zigzag scan unit 130.

Reverse zigzag scan unit 130 performs, onto the coefficient data decoded by Huffman decoding unit 110, a process reverse to the above-described zigzag scan, thereby performing a process to convert the one-dimensional array of coefficient data into an 8×8 two-dimensional array of coefficient data. Dequantization unit 140 performs a process to multiply each of the 8×8 coefficient data output and sent from reverse zigzag scan unit 130, by a corresponding numerical value of the quantization table defined by the DQT marker also sent from reverse zigzag scan unit 130, thereby converting it into dequantized coefficient data. IDCT (Inverse Discrete Cosine Transform) unit 150 performs a process to convert the coefficient data converted by dequantization unit 140, into 8×8-pixel YUV luminance color difference data. The YUV luminance color difference data is finally converted into RGB color data.

CITATION LIST

Patent Literature

PTL 1: Japanese Patent Laying-Open No. 7-99579

SUMMARY OF INVENTION

Technical Problem

As shown in FIG. 11, regarding the Huffman codes for defining the numbers of zero runs and the group numbers, 12 Huffman codes, i.e., 12 group numbers of 0 to B, are required for the DC coefficients, whereas for the AC coefficients, 162 Huffman codes are required, i.e., combinations of 16 numbers of zero runs of 0 to F and 10 group numbers of 1 to A plus a combination of the number of zero runs of 0 and a group number of 0 and a combination of the number of zero runs of F and a group number of 0. 174 Huffman codes are required in total.

Therefore, in codeword detection unit 117 of conventional image decoding device 100 described above, when detecting pieces of Huffman code data from pieces of variable length code data, a coincidence detection process is performed repeatedly 174 times to detect a group of data coinciding with the pieces of Huffman code data by sequentially comparing (i) each of the pieces of data included in the group and sequentially arranged from the forefront of the variable length code data with (ii) the 174 pieces of Huffman code data.

However, according to the knowledge of the present inventors, when compressing image data at a general compression ratio, frequencies of occurrence of Huffman codes that encode coefficient data based on an 8×8-pixel block as a unit are not the same among all the Huffman codes. Frequencies of occurrence of a plurality of certain Huffman codes are high.

Therefore, when the above-described coincidence detection process is performed for the Huffman codes with predetermined high frequencies of occurrence, the Huffman code data in the variable length code data can be detected in a short detection processing time at a considerably high probability. By employing such a process, the processing time in codeword detection unit 116 can be shortened.

Moreover, when image decoding device 100 is implemented by an electronic circuit, the process in code analysis unit 115 of Huffman decoding unit 110 needs to be done within 1 clock; however, the process in code analysis unit 115 can be done within 1 clock with a sufficient margin. Therefore, also in this sense, conventionally, there is a room for shortening the processing time in code analysis unit 115.

The present invention has been made in view of the above circumstance, and has an object to provide an image decoding device that can shorten a decoding time as the whole by shortening a processing time in a Huffman decoding unit.

Solution to Problem

In order to solve the above-described problem, the present invention is directed to an image decoding device including a Huffman decoding unit configured to decode compressed image data, the compressed image data being compressed by a Huffman encoding process, the compressed image data having a structure in which Huffman codes and pieces of variable length code data are connected continuously, each Huffman code encoding zero run information and group number information, the pieces of variable length code data being subsequent to the respective Huffman codes, each of the pieces of variable length code data having an additional bit handled as a unit, wherein the Huffman decoding unit include
a code analysis unit configured to analyze the pieces of variable length code data sequentially received, and sequentially recognize and output pieces of zero run information and group number information relating to the pieces of variable length code data, and
a frequency conversion unit configured to sequentially generate pieces of coefficient information based on the pieces of zero run information and group number information sequentially output from the code analysis unit, and output the pieces of coefficient information, and
the code analysis unit includes an input control unit configured to collectively send a plurality of pieces of variable length code data,
a primary analysis processing unit configured to
process a first piece of received variable length code data without applying a restriction,
recognize zero run information, group number information, and additional bit information relating to the first piece of received variable length code data, and
output the recognized zero run information and additional bit information to the frequency conversion unit, and
a continuous analysis processing unit configured to
process one or more pieces of variable length code data subsequent to the piece of variable length code data processed by the primary analysis processing unit,
when a corresponding piece of variable length code data in the one or more pieces of variable length code data is variable length code data targeted for a predetermined process, perform a process to recognize zero run information, group number information, and additional bit information relating to the corresponding piece of variable length code data in the one or more pieces of variable length code data, and output the recognized zero run information and additional bit information to the frequency conversion unit, and
when the corresponding piece of variable length code data in the one or more pieces of variable length code data is not the variable length code data targeted for the predetermined process, perform a process to discard the corresponding and subsequent pieces of variable length code data in the one or more pieces of variable length code data, and then send, to the input control unit, a signal for sending data subsequent to the variable length code data having been through the recognition process.

According to this image decoding device, the plurality of pieces of variable length code data are collectively received by way of the input control unit. First, the first piece of received variable length code data is processed in the primary analysis processing unit without a particularly restriction, thereby recognizing the zero run information, group number information, and additional bit information relating thereto. The recognized zero run information and additional bit information are output to the frequency conversion unit.

Specifically, for the total of 174 Huffman codes, i.e., 12 Huffman codes set for the above-described DC coefficient data and 162 Huffman codes set for the AC coefficients, the primary analysis processing unit detects which Huffman code in the first piece of received variable length code data coincides with, thereby recognizing the Huffman code (codeword) in the variable length code data.

From the recognized Huffman code, the primary analysis processing unit recognizes the number of zero runs and group number (in the case of the DC coefficient, only the group number) corresponding to this Huffman code. After recognizing the additional bit length from the recognized group number, the primary analysis processing unit recognizes the additional bit in the variable length code data from this additional bit length. The primary analysis processing unit outputs, to the frequency conversion unit, respective pieces of information relating to the recognized number of zero runs and the recognized additional bit.

Next, the continuous analysis processing unit processes the one or more pieces of variable length code data subsequent to the piece of variable length code data processed by the primary analysis processing unit. When the corresponding piece of variable length code data in the one or more pieces of the variable length code data is the variable length code data targeted for the predetermined process, the zero run information, group number information, and additional bit information relating to the corresponding piece of variable length code data in the one or more pieces of variable length code data are recognized sequentially, and the recognized zero run information and additional bit information are output to the frequency conversion unit. On the other hand, when the corresponding piece of variable length code data in the one or more pieces of the variable length code data is not the variable length code data targeted for the predetermined process, the corresponding and subsequent pieces of variable length code data in the one or more pieces of the variable length code data are discarded.

After performing these processes, the continuous analysis processing unit performs the process to send, to the input control unit, the signal for sending the data subsequent to the variable length code data having been through the recognition process.

Here, the pieces of variable length code data targeted for the process in this continuous analysis processing unit are set experientially in advance. As described above, when the image data is compressed at a general compression ratio, the frequencies of occurrence of the Huffman codes each encoding the coefficient data based on an 8×8-pixel block as a unit are not the same among all the Huffman codes. The frequencies of occurrence of a plurality of certain Huffman codes are high.

Therefore, the pieces of variable length code data highly likely to be the targets for the process in the continuous analysis processing unit are pieces of variable length code data relating to the Huffman codes with high frequencies of occurrence as described above. In view of this, only the pieces of variable length code data relating to the Huffman codes, i.e., zero run information and group number information, selected from those with such high frequencies of occurrence are processed in the continuous analysis processing unit.

In this way, the process of detecting the Huffman codes in the pieces of variable length code data can be performed in a short period of time. That is, if all the pieces of variable length code data are the targets for the process as described above, the coincidence detection process for the 174 Huffman codes need to be performed to detect a Huffman code; however, by narrowing down the targets for the process to the pieces of variable length code data relating to the specific Huffman codes with high frequencies of occurrence, a coincidence detection time for detecting the Huffman codes can be shortened, whereby a time required for the process can be shortened without a waste in the process.

Moreover, since each piece of variable length code data not targeted for the process in the continuous analysis processing unit is securely processed again in the primary analysis processing unit, the processing time can be shortened while ensuring that the compressed image data is securely decoded.

Thereafter, the sending process by the input control unit and the process by the primary analysis processing unit and the continuous analysis processing unit are performed repeatedly in the same manner as described above until the processing of the collection of compressed image data is finished.

In the frequency conversion unit, based on the pieces of zero run information and additional bit information output sequentially from the code analysis unit, the pieces of coefficient information are sequentially generated.

It should be noted that the continuous analysis processing unit in the present invention may be configured to sequentially process the plurality of pieces of variable length code data, and apply a more strict restriction on a piece of variable length code data located more backward in the plurality of pieces of variable length code data with regard to the variable length code data targeted for the predetermined process, i.e., gradually narrow down the variable length code data targeted for the process.

The image decoding device is generally constituted of an electronic circuit. In this case, the series of processes in the input control unit, the primary analysis processing unit, and the continuous analysis processing unit included in the code analysis unit need to be completed within 1 clock. By gradually shortening the time required for the coincidence detection process in the continuous analysis processing unit, the number of pieces of variable length code data that can be processed within 1 clock can be increased, whereby the processing time can be shortened.

Advantageous Effects of Invention

As described above, according to the present invention, since the targets for the process in the continuous analysis processing unit can be narrowed down to the pieces of variable length code data relating to the specific Huffman codes with high frequencies of occurrence, the coincidence detection time for detecting the Huffman codes can be shortened, thereby shortening the time required for the process without a waste in the process.

Moreover, since each piece of variable length code data not targeted for the process in the continuous analysis processing unit is securely processed again in the primary analysis processing unit, the processing time can be shortened while ensuring that the compressed image data is securely decoded.

BRIEF DESCRIPTION OF DRAWINGS

FIG. 4 is an explanatory diagram for illustrating a process in the code analysis unit according to the present embodiment.
FIG. 5 is an explanatory diagram showing frequencies of occurrence of the numbers of zero runs and group numbers when image data is compressed.
FIG. 6(A) and FIG. 6(B) are explanatory diagram for illustrating a process in the code analysis unit according to the present embodiment.
FIG. 11 is an explanatory drawing for illustrating a process in the conventional code analysis unit.

DESCRIPTION OF EMBODIMENTS

Figure 1:
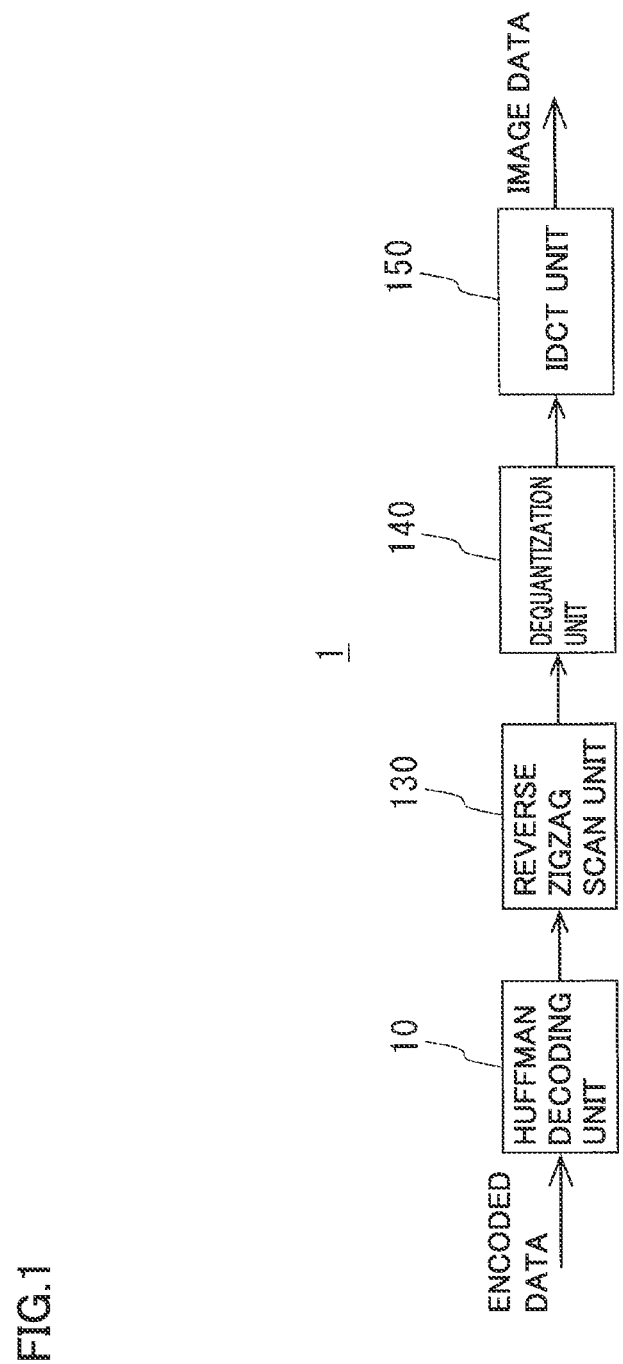
FIG. 1 is a block diagram showing a schematic configuration of an image decoding device according to one embodiment of the present invention.
Figure 7:
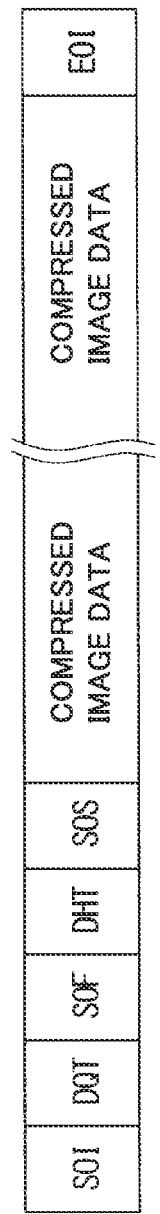
FIG. 7 is an explanatory diagram showing a structure of encoded data generated by the image encoding device.
Figure 8:
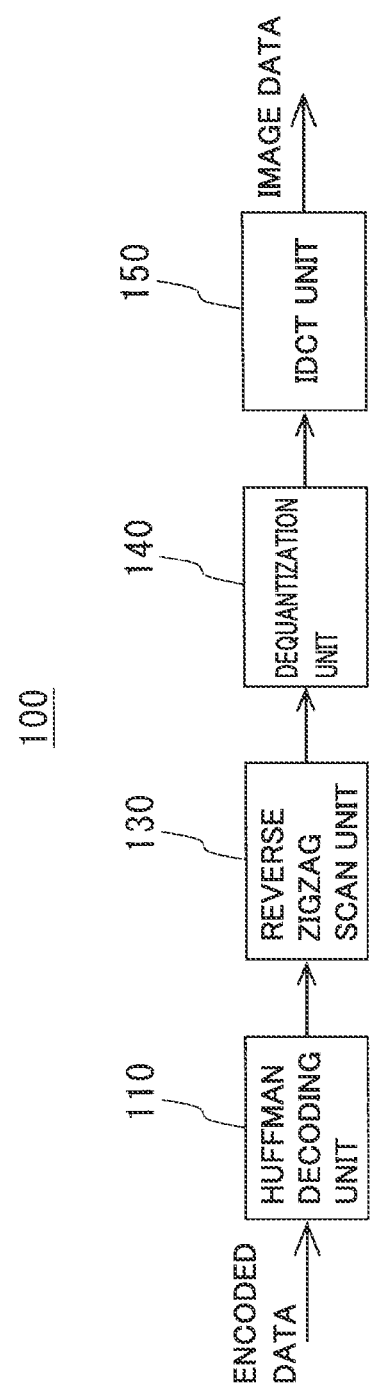
FIG. 8 is a block diagram showing a schematic configuration of a conventional image decoding device.
Figure 9:
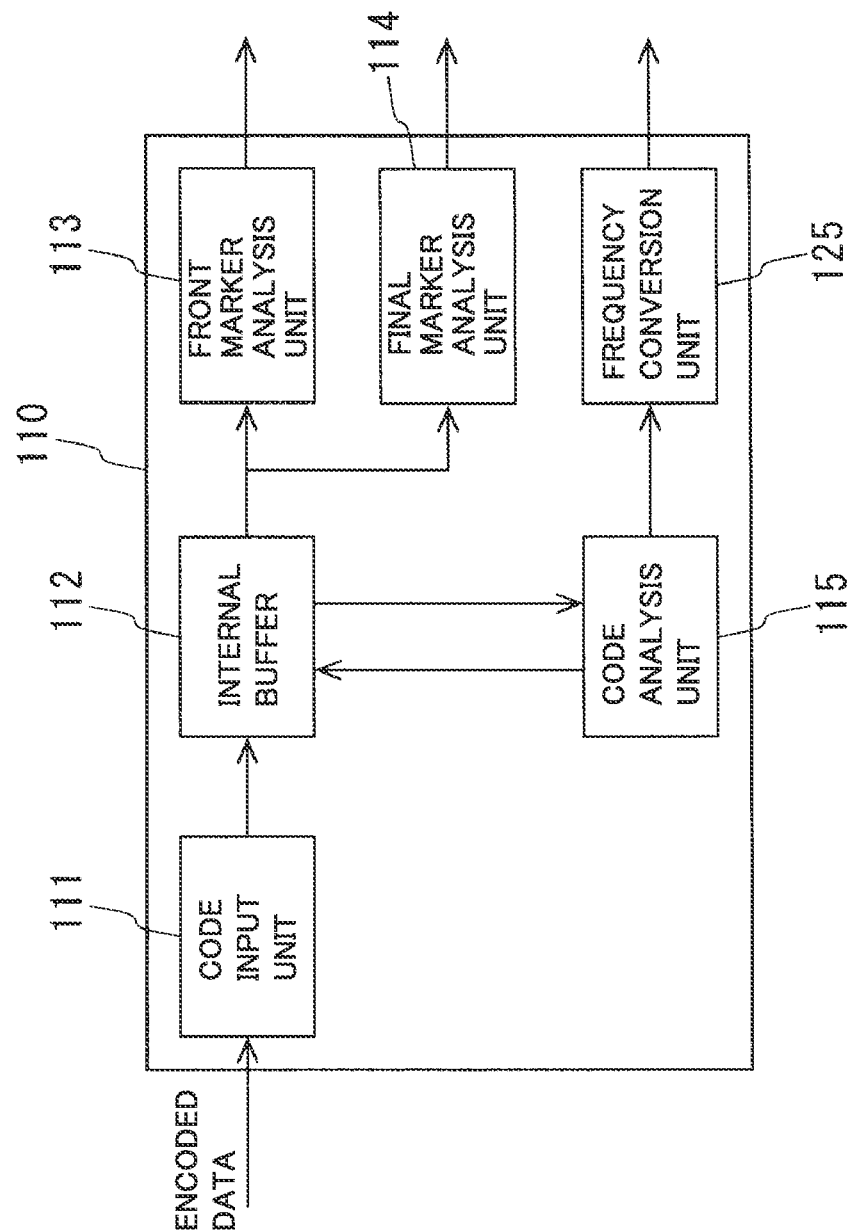
FIG. 9 is a block diagram showing a configuration of a conventional Huffman decoding unit.
Figure 10:
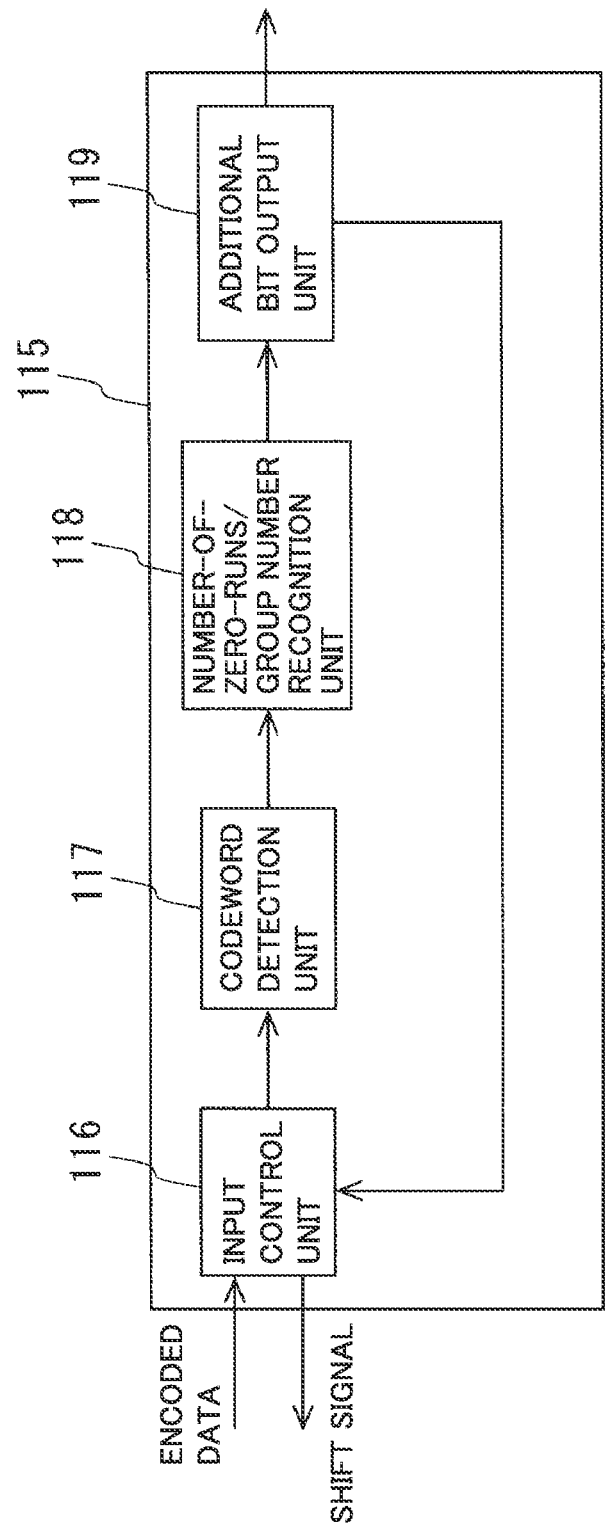
FIG. 10 is a block diagram showing a configuration of a conventional code analysis unit.

The following describes specific embodiments of the present invention with reference to figures. FIG. 1 is a block diagram showing a schematic configuration of an image decoding device according to the present embodiment. As shown in FIG. 1, image decoding device 1 according to the present example is different from the above-described conventional image decoding device 100 shown in FIG. 8 only in the configuration of Huffman decoding unit 10. Reverse zigzag scan unit 130, dequantization unit 140, and IDCT unit 150 are the same as those of conventional image decoding device 100. Therefore, the same components are given the same reference characters in FIG. 1 and are not described below in detail. Moreover, the encoded data (JPEG stream) handled in the present example has the same data structure as that of the encoded data shown in FIG. 7.

Figure 2:
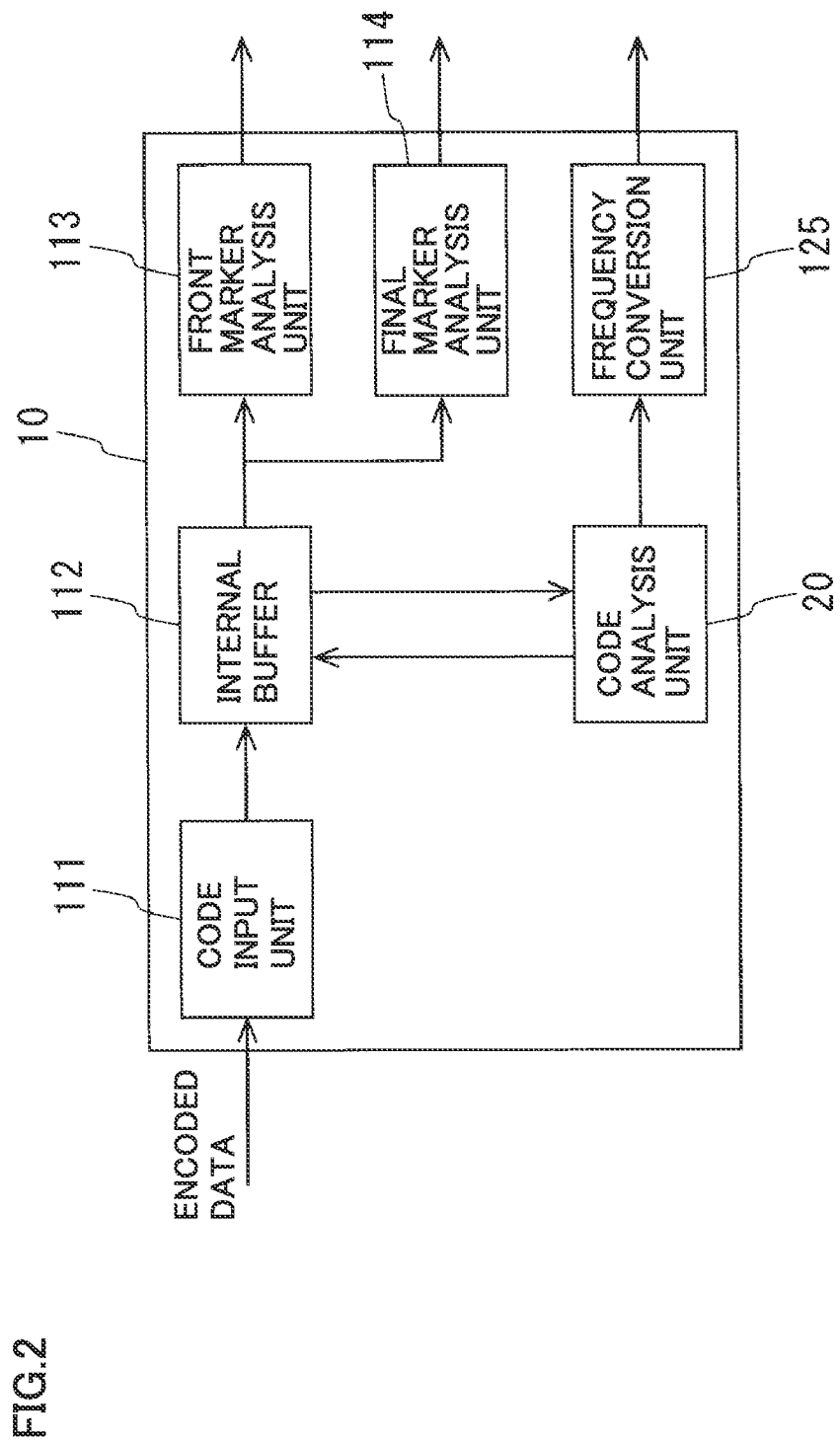
FIG. 2 is a block diagram showing a configuration of a Huffman decoding unit according to the present embodiment.

Moreover, as shown in FIG. 2, Huffman decoding unit 10 of the present example is constituted of a code input unit 111, an internal buffer 112, a front marker analysis unit 113, a final marker analysis unit 114, a code analysis unit 20, and a frequency conversion unit 125; however, code input unit 111, internal buffer 112, front marker analysis unit 113, final marker analysis unit 114, and frequency conversion unit 125 have the same configurations as those in conventional image decoding device 100, and are therefore given the same reference characters and are not described in detail.

It should be noted that image decoding device 1 of the present example is implemented by hardware, such as an electronic device including an appropriate electronic circuit for performing each process. Alternatively, image decoding device 1 can be implemented by a general-purpose computer including a CPU, a ROM, a RAM, and the like. When implemented by a computer, respective functions of code input unit 111, front marker analysis unit 113, final marker analysis unit 114, code analysis unit 20, frequency conversion unit 125, zigzag scan unit 130, dequantization unit 140, and IDCT unit 150 are implemented by computer programs.

Figure 3:
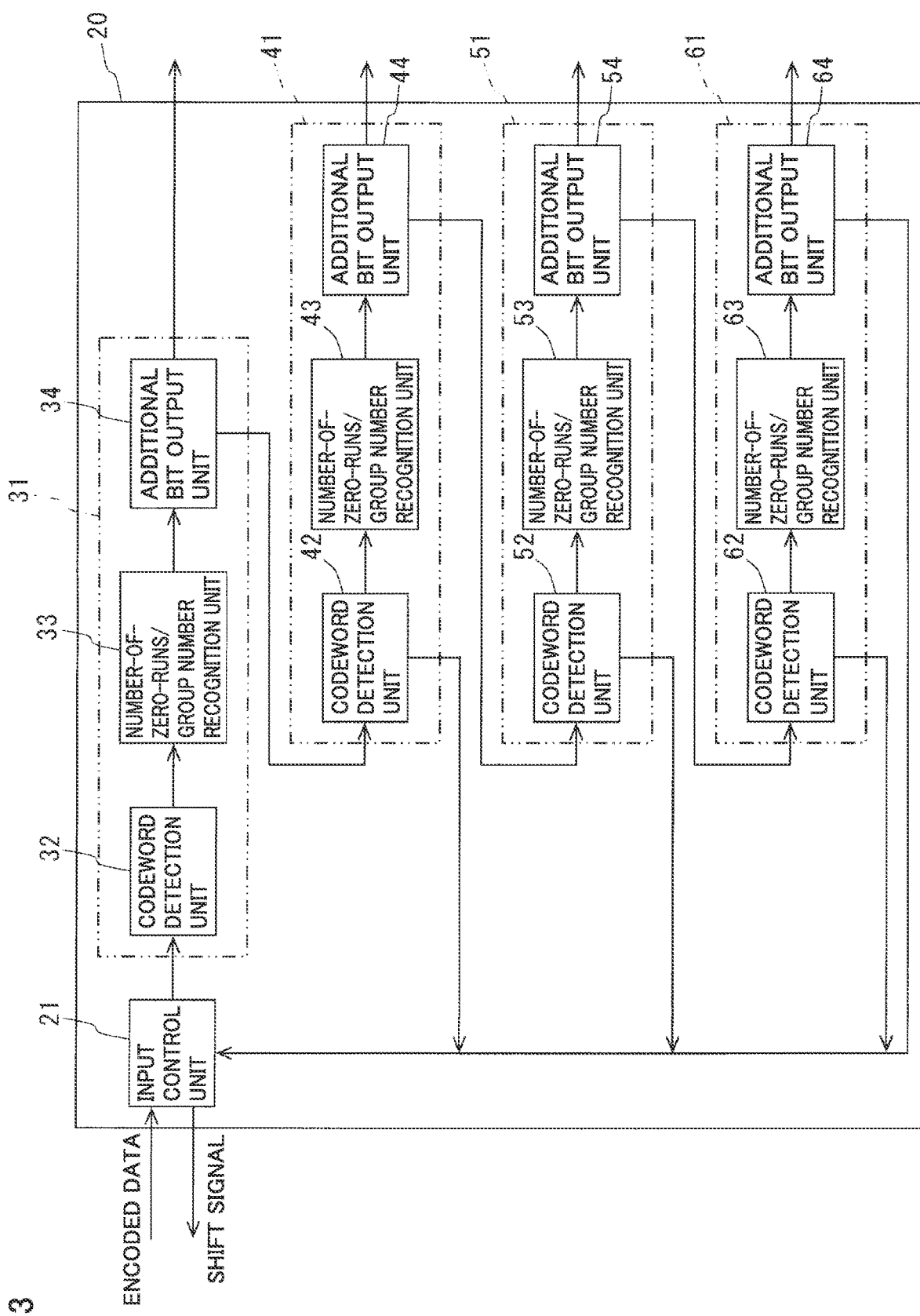
FIG. 3 is a block diagram showing a configuration of a code analysis unit according to the present embodiment.

As shown in FIG. 3, code analysis unit 20 is constituted of an input control unit 21, a primary analysis processing unit 31, a secondary analysis processing unit 41, a tertiary analysis processing unit 51, and a quaternary analysis processing unit 61. Secondary analysis processing unit 41, tertiary analysis processing unit 51, and quaternary analysis processing unit 61 among them constitute a continuous analysis processing unit.

Input control unit 21 controls sending of encoded data received from internal buffer 112. Specifically, input control unit 21 sequentially sends the above-described data relating to the markers. For the pieces of variable length code data subsequent to the SOS marker, input control unit 21 sends an amount of data including at least four pieces of variable length code data in consideration of a maximum data amount that a piece of variable length code data as a unit can have. Moreover, input control unit 21 sends, to internal buffer 112, a shift signal corresponding to the bit length of the variable length code data processed by each of primary analysis processing unit 31, secondary analysis processing unit 41, tertiary analysis processing unit 51, and quaternary analysis processing unit 61.

Primary analysis processing unit 31 is constituted of a codeword detection unit 32, a number-of-zero-runs/group number recognition unit 33, and an additional bit output unit 34. Secondary analysis processing unit 41 is constituted of a codeword detection unit 42, a number-of-zero-runs/group number recognition unit 43, and an additional bit output unit 44. Tertiary analysis processing unit 51 is constituted of a codeword detection unit 52, a number-of-zero-runs/group number recognition unit 53, and an additional bit output unit 54. Quaternary analysis processing unit 61 is constituted of a codeword detection unit 62, a number-of-zero-runs/group number recognition unit 63, and an additional bit output unit 64. Each unit will be described as follows.

A. Primary Analysis Processing Unit 31

Based on a Huffman code table recognized from the DHT marker in the encoded data, codeword detection unit 32 performs a process to detect data (hereinafter "Huffman code data") relating to a Huffman code (codeword) in a first piece of received variable length code data.

On this occasion, as shown in FIG. 4, codeword detection unit 32 recognizes Huffman code data existing in the first piece of variable length code data by performing a coincidence detection (recognition) process with regard to 174 Huffman codes in total, specifically, 12 Huffman codes for the DC coefficients, i.e., group numbers of 0 to B, as well as 162 Huffman codes for the AC coefficients, i.e., combinations of 16 numbers of zero runs of 0 to F and 10 group numbers of 1 to A plus a combination of the number of zero runs of 0 and a group number of 0 and a combination of the number of zero runs of F and a group number of 0.

Codeword detection unit 32 sends the detected Huffman code data and the plurality of pieces of received variable length code data to number-of-zero-runs/group number recognition unit 33.

Number-of-zero-runs/group number recognition unit 33 performs a process to: based on the Huffman code data sent from codeword detection unit 32, recognize the number of zero runs and group number corresponding to the Huffman code data; then recognize the additional bit length corresponding to the recognized group number; and send, to additional bit output unit 34, data relating to the recognized number of zero runs, group number, and additional bit length, as well as the data relating to the bit length of the Huffman code and the plurality of pieces of variable length code data, each of which is sent from codeword detection unit 32.

Based on the data relating to the bit length of the Huffman code and the additional bit length and sent from number-of-zero-runs/group number recognition unit 33, additional bit output unit 34 extracts, from the first piece of variable length code data, the data relating to the additional bit corresponding to the additional bit length. Additional bit output unit 34 performs a process to: send, to frequency conversion unit 125, the data relating to the number of zero runs and sent from number-of-zero-runs/group number recognition unit 33, and the extracted data relating to the additional bit; and send, to codeword detection unit 42, the data relating to the bit length of the first piece of variable length code data, and the second and subsequent pieces of variable length code data with the first piece of variable length code data being deleted.

B. Secondary Analysis Processing Unit 41

Based on the Huffman code table, codeword detection unit 42 performs a process to detect Huffman code data in the second piece of variable length code data of the second and subsequent pieces of variable length code data sent from additional bit output unit 34.

On this occasion, as shown in FIG. 4, codeword detection unit 42 recognize Huffman code data existing in the second piece of variable length code data by performing a coincidence detection process with regard to 19 Huffman codes in total for the AC coefficients, specifically, combinations of the number of zero runs of 0 and group numbers of 0 to 7, combinations of the number of zero runs of 1 and group numbers of 1 to 3, combinations of the number of zero runs of 2 and group numbers of 1 to 2, combinations of the number of zero runs of 3 and group numbers of 1 to 2, a combination of the number of zero runs of 4 and a group number of 1, a combination of the number of zero runs of 5 and a group number of 1, a combination of the number of zero runs of 6 and a group number of 1, and a combination of the number of zero runs of 7 and a group number of 1.

When one of the 19 pieces of Huffman code data is detected, codeword detection unit 42 sends the Huffman code data and the second and subsequent pieces of received variable length code data to number-of-zero-runs/group number recognition unit 43. On the other hand, when none of the 19 pieces of Huffman code data is detected, codeword detection unit 42 performs a process to: send, to input control unit 21, the data relating to the bit length of the first piece of variable length code data and sent from additional bit output unit 34; and discard all the pieces of received data. Accordingly, subsequent processes are not performed.

It should be noted that when the data relating to the bit length of the first piece of variable length code data is received, input control unit 21 sends, to internal buffer 112 as the shift signal, the received signal relating to the bit length. In internal buffer 112, the data (processed piece of variable length code data) corresponding to the bit length corresponding to the received shift signal is deleted from the forefront of the stored data, thereby bringing the next piece of variable length code data to the forefront.

From the Huffman code data sent from codeword detection unit 42, number-of-zero-runs/group number recognition unit 43 recognizes the number of zero runs and group number corresponding to the Huffman code data. Then, number-of-zero-runs/group number recognition unit 43 recognizes the additional bit length corresponding to the recognized group number. Number-of-zero-runs/group number recognition unit 43 sends, to additional bit output unit 44, the data relating to the recognized number of zero runs, group number, and additional bit length, the data relating to the bit length of the Huffman code and sent from codeword detection 42, and the second and subsequent pieces of variable length code data.

Based on the data relating to the bit length of the Huffman code and the additional bit length and sent from number-of-zero-runs/group number recognition unit 43, additional bit output unit 44 extracts, from the second piece of variable length code data, the data relating to the additional bit corresponding to the additional bit length. Additional bit output unit 44 sends, to frequency conversion unit 125, the data relating to the number of zero runs and sent from number-of-zero-runs/group number recognition unit 43 and the extracted data relating to the additional bit. Additional bit output unit 44 sends, to codeword detection unit 52, data relating to a total bit length of the first and second pieces of variable length code data, and the third and subsequent pieces of variable length code data with the second piece of variable length code data being deleted.

C. Tertiary Analysis Processing Unit 51

Based on the Huffman code table, codeword detection unit 52 performs a process to detect Huffman code data in the third piece of variable length code data of the third and subsequent pieces of variable length code data sent from additional bit output unit 44.

On this occasion, as shown in FIG. 4, codeword detection unit 52 recognizes Huffman code data existing in the third piece of variable length code data by performing a coincidence detection process with regard to 13 Huffman codes in total for the AC coefficients, specifically, combinations of the number of zero runs of 0 and group numbers of 0 to 7, combinations of the number of zero runs of 1 and group numbers of 1 to 2, a combination of the number of zero runs of 2 and a group number of 1, a combination of the number of zero runs of 3 and a group number of 1, and a combination of the number of zero runs of 4 and a group number of 1.

When one of the 13 pieces of Huffman code data is detected, codeword detection unit 52 sends the Huffman code data and the third and subsequent pieces of received variable length code data to number-of-zero-runs/group number recognition unit 53. On the other hand, when none of the 13 pieces of Huffman code data is detected, codeword detection unit 52 performs a process to: send, to input control unit 21, the data relating to the total bit length of the first and second pieces of variable length code data and sent from additional bit output unit 44; and discard all the pieces of received data. Accordingly, subsequent processes are not performed.

When the data relating to the total bit length of the first and second pieces of variable length code data is received, input control unit 21 sends, to internal buffer 112 as the shift signal, the received signal relating to the bit length. In internal buffer 112, the data corresponding to the bit length corresponding to the received shift signal is deleted from the forefront of the stored data, thereby bringing the next piece of variable length code data to the forefront.

From the Huffman code data sent from codeword detection unit 52, number-of-zero-runs/group number recognition unit 53 recognizes the number of zero runs and the group number corresponding to the Huffman code data. Then, number-of-zero-runs/group number recognition unit 53 recognizes the additional bit length corresponding to the recognized group number. Number-of-zero-runs/group number recognition unit 53 sends, to additional bit output unit 54, the data relating to the recognized number of zero runs, group number, and additional bit length, the data relating to the bit length of the Huffman code and sent from codeword detection 52, and the third and subsequent pieces of variable length code data.

Based on the data relating to the bit length of the Huffman code and the data relating to the additional bit length both sent from number-of-zero-runs/group number recognition unit 53, additional bit output unit 54 extracts, from the third piece of variable length code data, the data relating to the additional bit corresponding to the additional bit length. Additional bit output unit 54 sends, to frequency conversion unit 125, the data relating to the number of zero runs and sent from number-of-zero-runs/group number recognition unit 53 and the extracted data relating to the additional bit. Additional bit output unit 54 sends, to codeword detection unit 62, data relating to a total bit length of the first to third pieces of variable length code data, and the fourth and subsequent pieces of variable length code data with the third piece of variable length code data being deleted.

D. Quaternary Analysis Processing Unit 61

Based on the Huffman code table, codeword detection unit 62 performs a process to detect Huffman code data in the fourth piece of variable length code data of the fourth and subsequent pieces of variable length code data sent from additional bit output unit 64.

On this occasion, as shown in FIG. 4, codeword detection unit 62 recognizes Huffman code data existing in the fourth piece of variable length code data by performing a coincidence detection process with regard to 11 Huffman codes in total for the AC coefficients, specifically, combinations of the number of zero runs of 0 and group numbers of 0 to 7, combinations of the number of zero runs of 1 and group numbers of 1 to 2, and a combination of the number of zero runs of 2 and a group number of 1.

When one of the 11 pieces of Huffman code data is detected, codeword detection unit 62 sends the Huffman code data and the fourth and subsequent pieces of variable length code data to number-of-zero-runs/group number recognition unit 63. On the other hand, when none of the 11 pieces of Huffman code data is detected, codeword detection unit 62 performs a process to: send, to input control unit 21, the data relating to the total bit length of the first to third piece of variable length code data and sent from additional bit output unit 54; and discard all the pieces of received data. Accordingly, subsequent processes are not performed.

When the data relating to the total bit length of the first to third piece of variable length code data is received, input control unit 21 sends, to internal buffer 112 as the shift signal, the received signal relating to the bit length. In internal buffer 112, the data corresponding to the bit length corresponding to the received shift signal is deleted from the forefront of the stored data, thereby bringing the next piece of variable length code data to the forefront.

From the Huffman code data sent from codeword detection unit 62, number-of-zero-runs/group number recognition unit 63 recognizes the number of zero runs and group number corresponding to the Huffman code data. Then, number-of-zero-runs/group number recognition unit 63 recognizes the additional bit length corresponding to the recognized group number. Number-of-zero-runs/group number recognition unit 63 sends, to additional bit output unit 64, the data relating to the recognized number of zero runs, group number, and additional bit length, the data relating to the bit length of the Huffman code and sent from codeword detection 62, and the fourth and subsequent pieces of variable length code data.

Based on the data relating to the bit length of the Huffman code and the data relating to the additional bit length both sent from number-of-zero-runs/group number recognition unit 63, additional bit output unit 64 extracts, from the fourth piece of variable length code data, the data relating to the additional bit corresponding to the additional bit length. Additional bit output unit 64 performs a process to: send, to frequency conversion unit 125, the data relating to the number of zero runs and sent from number-of-zero-runs/ group number recognition unit 63 and the extracted data relating to the additional bit; send, to input control unit 21, data relating to the total bit length of the first to fourth pieces of variable length code data; and discard all the pieces of received data.

It should be noted that the above-described Huffman codes targeted for the detection in respective codeword detection units 42, 52, 62 are set experientially in advance. FIG. 5 shows frequencies of occurrence of the numbers of zero runs and the group numbers for the AC coefficients, in other words, shows frequencies of occurrence of the Huffman codes, when image data is compressed at a general compression ratio of 20%. As shown in FIG. 5, the frequencies of occurrence of the numbers of zero runs and the group numbers are not the same among all the combinations. The frequencies of occurrence of certain numbers of zero runs and certain group numbers relating to a plurality of certain combinations are high.

Specifically, as surrounded by a thick solid line in FIG. 5, when the number of zero runs is 0, the frequencies of occurrence of the group numbers of 0 to 7 are high, when the number of zero runs is 1, the frequencies of occurrence of the group numbers of 1 to 3 are high, when the number of zero runs is 2 and 3, the frequencies of occurrence of the group numbers of 1 and 2 are high in each case, and when the number of zero runs is 4, 5, 6, and 7, the frequency of occurrence of the group number of 1 is high in each case.

Therefore, the pieces of variable length code data highly likely to be the targets for the processes in secondary analysis processing unit 41, tertiary analysis processing unit 51, and quaternary analysis processing unit 61 are pieces of variable length code data relating to the Huffman codes with high frequencies of occurrence as described above. In view of this, only the pieces of variable length code data relating to the Huffman codes, i.e., zero run information and group number information, selected from those with such high frequencies of occurrence are processed in each of secondary analysis processing unit 41, tertiary analysis processing unit 51, and quaternary analysis processing unit 61.

In this way, the process of detecting the Huffman codes in the pieces of variable length code data can be performed in a short period of time. That is, if all the pieces of variable length code data are targeted for the processes, the coincidence detection process for the 174 Huffman codes needs to be performed to detect a Huffman code as described above; however, by narrowing down the targets for the processes to the pieces of variable length code data relating to the specific Huffman codes with high frequencies of occurrence, a coincidence detection time for detecting the Huffman codes can be shortened, whereby a time required for the process can be shortened without a waste in the process.

Moreover, the pieces of variable length code data relating to the 19 pieces of Huffman code data are targeted for the process in secondary analysis processing unit 41, the pieces of variable length code data relating to the 13 pieces of Huffman code data are targeted for the process in tertiary analysis processing unit 51, and the pieces of variable length code data relating to the 11 pieces of Huffman code data are targeted for the process in quaternary analysis processing unit 61. Since the targets for the processes are gradually narrowed down, the processing times become gradually shorter from the processing time in secondary analysis processing unit 41 to the processing time in quaternary analysis processing unit 61. Image decoding device 1 of the present example is generally constituted of an electronic circuit. In this case, the processes from input control unit 21 to additional bit output unit 64 of code analysis unit 20 need to be completed within 1 clock. Therefore, by shortening the processing times gradually, the number of pieces of variable length code data that can be processed within 1 clock can be increased, whereby the processing time can be shortened.

Moreover, since each piece of variable length code data not targeted for the processes in secondary analysis processing unit 41 to quaternary analysis processing unit 61 is securely processed again in primary analysis processing unit 31, the processing time can be shortened while ensuring that the compressed image data is securely decoded.

According to image decoding device 1 configured as described above in the present example, under control of input control unit 21, the encoded data is first sent from internal buffer 112, and an amount of data including at least four pieces of variable length code data of the pieces of variable length code data subsequent to the SOS marker is collectively sent. Such pieces of variable length code data are first sent to and processed in primary analysis processing unit 31.

Specifically, in primary analysis processing unit 31, codeword detection unit 32 performs a detection process onto the first piece of variable length code data with regard to 174 Huffman codes so as to recognize the Huffman code data in the first piece of variable length code data. Then, the number of zero run and group number corresponding to the recognized Huffman code data, as well as the additional bit length corresponding to the group number are recognized by number-of-zero-runs/group number recognition unit 33. In additional bit output unit 34, based on the data relating to the additional bit length, the data relating to the additional bit corresponding to the additional bit length is extracted from the first piece of variable length code data. The data relating to the number of zero runs and the extracted data relating to the additional bit are sent from additional bit output unit 34 to frequency conversion unit 125. The second and subsequent pieces of variable length code data are sent to codeword detection unit 42 of secondary analysis processing unit 41.

Next, in codeword detection unit 42, the detection process is performed onto the second pieces of variable length code data with regard to the 19 Huffman codes described above. When one of the 19 pieces of Huffman code data is detected, the number of zero runs and the group number corresponding to the recognized Huffman code data as well as the additional bit length corresponding to the group number are recognized by number-of-zero-runs/group number recognition unit 43. In additional bit output unit 44, based on the data relating to the additional bit length, the data relating to the additional bit corresponding to the additional bit length is extracted from the second piece of variable length code data. The data relating to the number of zero runs and the extracted data relating to the additional bit are sent to frequency conversion unit 125. The third and subsequent pieces of variable length code data are sent to codeword detection unit 52 of tertiary analysis processing unit 51.

On the other hand, when none of the 19 pieces of Huffman code data is detected in codeword detection unit 42, the data relating to the bit length of the first piece of variable length code data and sent from additional bit output unit 34 is sent to input control unit 21, and the subsequent processes are not performed. Input control unit 21 sends, to internal buffer 112, the received signal relating to the bit length as the shift signal. In internal buffer 112, the data corresponding to the bit length corresponding to the received shift signal is deleted. Accordingly, the next piece of variable length code data is brought to the forefront.

Next, in codeword detection unit 52, the detection process is performed onto the third piece of variable length code data with regard to the 13 Huffman codes described above. When one of the 13 pieces of Huffman code data is detected, the number of zero runs and group number corresponding to the recognized Huffman code data, as well as the additional bit length corresponding to the group number are recognized by number-of-zero-runs/group number recognition unit 53. In additional bit output unit 54, based on the data relating to the additional bit length, the data relating to the additional bit corresponding to the additional bit length is extracted from the third piece of variable length code data. The data relating to the number of zero runs and the extracted data relating to the additional bit are sent to frequency conversion unit 125.

The fourth and subsequent pieces of variable length code data are sent to codeword detection unit 62 of quaternary analysis processing unit 61.

On the other hand, when none of the 13 pieces of Huffman code data is detected in codeword detection unit 52, the data relating to the total bit length of the first and second pieces of variable length code data and sent from additional bit output unit 44 is sent to input control unit 21, and the subsequent processes are not performed. Input control unit 21 sends, to internal buffer 112, the received signal relating to the bit length as the shift signal. In internal buffer 112, the data corresponding to the bit length corresponding to the received shift signal is deleted. Accordingly, the next piece of variable length code data is brought to the forefront.

Next, in codeword detection unit 62, the detection process is performed onto the fourth piece of variable length code data with regard to the 11 Huffman codes described above. When one of the 11 pieces of Huffman code data is detected, the number of zero runs and group number corresponding to the recognized Huffman code data as well as the additional bit length corresponding to the group number are recognized by number-of-zero-runs/group number recognition unit 63. In additional bit output unit 64, based on the data relating to the additional bit length, the data relating to the additional bit corresponding to the additional bit length is extracted from the fourth piece of variable length code data. The data relating to the number of zero runs and the extracted data relating to the additional bit are sent to frequency conversion unit 125. The data relating to the total bit length of the first to fourth pieces of variable length code data is sent to input control unit 21.

On the other hand, when none of the 11 pieces of Huffman code data is detected in codeword detection unit 62, the data relating to the total bit length of the first to third pieces of variable length code data and sent from additional bit output unit 64 is sent to input control unit 21, and the subsequent processes are not performed.

Input control unit 21 sends, to internal buffer 112, the received signal relating to the bit length as the shift signal. In internal buffer 112, the data corresponding to the bit length corresponding to the received shift signal is deleted. Accordingly, the next piece of variable length code data is brought to the forefront.

After the data including the at least four pieces of variable length code data collectively sent is processed as described above, the sending process by input control unit 21 and each process by primary analysis processing unit 31 to quaternary analysis processing unit 61 are performed in the same manner repeatedly until the processing of the collection of compressed image data is finished.

Thus, according to image decoding device 1, only the pieces of variable length code data relating to the Huffman codes, i.e., zero run information and group number information, selected from those with high frequencies of occurrence are processed in each of secondary analysis processing unit 41, tertiary analysis processing unit 51, and quaternary analysis processing unit 61 as described above. Hence, each of the processes for detecting the Huffman codes in secondary analysis processing unit 41, tertiary analysis processing unit 51, and quaternary analysis processing unit 61 can be performed in a short period of time.

FIG. 6(A) shows the process in code analysis unit 115 of conventional image decoding device 100, whereas FIG. 6(B) shows the process in code analysis unit 20 of image decoding device 1 of the present example.

As shown in FIG. 6(A), in code analysis unit 115 of conventional image decoding device 100, the coincidence detection process for the 174 Huffman codes needs to be performed in the Huffman code data detection process, with the result that the detection process takes long time. Therefore, as shown in FIG. 6(A), even though a series of processes of a process (A) in codeword detection unit 117, a process (B) in number-of-zero-runs/group number recognition unit 118, a process (C) in additional bit output unit 119 and a process (D) in input control unit 116 can be done within 1 clock, when a considerable amount of time remains therein, the remaining time is completely wasted unless the series of processes can be performed again within the remaining time.

On the other hand, in code analysis unit 20 of image decoding device 1 of the present example, as shown in FIG. 6(B), after the primary analysis process involving the coincidence detection process for the 174 pieces of Huffman code data as in the conventional art, the secondary to quaternary analysis processes each with a processing time significantly shorter than that of the primary analysis process can be performed within 1 clock. Hence, the four pieces of variable length code data can be processed within 1 clock, whereby the process for image decoding in Huffman decoding unit 10 can be shortened remarkably as compared with that in the conventional art.

It should be noted that according to a simple comparison in the number of times of performing the coincidence detection process, the time of a process $A_2$ in codeword detection unit 42 of secondary analysis processing unit 41 is about $11/100$ of the time of a process $A_1$ (equivalent to conventional process A) in codeword detection unit 32 of primary analysis processing unit 31, the time of a process $A_3$ in codeword detection unit 52 of tertiary analysis processing unit 51 is about $7/100$ of the time of process $A_1$, and the time of a process $A_4$ in codeword detection unit 62 of quaternary analysis processing unit 61 is about $6/10$ of the time of process $A_1$.

Moreover, in code analysis unit 20 of the present example, the pieces of variable length code data targeted for the processes in secondary analysis processing unit 41 to quaternary analysis processing unit 61 are narrowed down gradually and stepwisely. In this way, the processing times can become gradually shorter from the processing time of secondary analysis processing unit 41 to the processing time of quaternary analysis processing unit 61. Accordingly, the number of pieces of variable length code data that can be processed within 1 clock can be increased more effectively, whereby the processing time can be further shortened. It should be noted that a relation among the above-described processing times are as follows: $A_1 > A_2 > A_3 > A_4$.

Moreover, since each of the pieces of the variable length code data not targeted for the processes in secondary analysis processing unit 41 to quaternary analysis processing unit 61 is securely processed again in primary analysis processing unit 31, the processing time can be shortened while ensuring that the compressed image data is securely decoded.

Although one embodiment of the present invention has been described above, specific embodiments of the present invention are not limited thereto at all.

For example, in the above example, the continuous analysis processing unit is constituted of the three processing units, i.e., secondary analysis processing unit 41, tertiary analysis processing unit 51, and quaternary analysis processing unit 61; however, the number of the analysis processing units included in the continuous analysis processing unit is not limited to this. The continuous analysis processing unit may be constituted of one or more analysis processing units. That is, any configuration may be employed as long as time shortening can be attained as intended.

Moreover, the manner of narrowing down the targets for the processes in the continuous analysis processing unit (secondary analysis processing unit 41, tertiary analysis processing unit 51, and quaternary analysis processing unit 61 in the above example) is not limited to the one in the above example, and can be set appropriately to attain time shortening as intended.

REFERENCE SIGNS LIST

1: image decoding device
10: Huffman decoding unit
20: code analysis unit
21: input control unit
31: primary analysis processing unit
32: code analysis unit
33: number-of-zero-runs/group number recognition unit
34: additional bit output unit
41: secondary analysis processing unit
42: code analysis unit
43: number-of-zero-runs/group number recognition unit
44: additional bit output unit
51: tertiary analysis processing unit
52: code analysis unit
53: number-of-zero-runs/group number recognition unit
54: additional bit output unit
61: quaternary analysis processing unit
62: code analysis unit
63: number-of-zero-runs/group number recognition unit
64: additional bit output unit
111: code input unit
112: internal buffer
113: front marker analysis unit
114: final marker analysis unit
125: frequency conversion unit
130: reverse zigzag scan unit
140: dequantization unit
150: IDCT unit

The invention claimed is:

1. An image decoding device comprising Huffman decoding circuitry configured to decode compressed image data, the compressed image data being compressed by a Huffman encoding process, the compressed image data having a structure in which Huffman codes and pieces of variable length code data are connected continuously, each Huffman code encoding zero run information and group number information, the pieces of the variable length code data being subsequent to the respective Huffman codes, each of the pieces of the variable length code data having an additional bit handled as a unit, wherein the Huffman decoding circuitry includes
code analysis circuitry configured to analyze the pieces of the variable length code data sequentially received, and sequentially recognize and output pieces of the zero run information and the group number information relating to the pieces of the variable length code data, and
frequency conversion circuitry configured to sequentially generate pieces of coefficient information based on the pieces of the zero run information and the group number information sequentially output from the code analysis circuitry, and output the pieces of coefficient information, and the code analysis circuitry includes
input control circuitry configured to collectively send a plurality of pieces of the variable length code data,
primary analysis processing circuitry configured to
process a first piece of received variable length code data without applying a restriction,
recognize the zero run information, the group number information, and additional bit information relating to the first piece of received variable length code data, and
output the recognized zero run information and additional bit information to the frequency conversion circuitry, and
continuous analysis processing circuitry configured to
process one or more pieces of the variable length code data subsequent to the piece of the variable length code data processed by the primary analysis processing circuitry,
when a corresponding piece of variable length code data in the one or more pieces of the variable length code data is variable length code data targeted for a predetermined process, perform a process to the recognize zero run information, the group number information, and the additional bit information relating to the corresponding piece of the variable length code data in the one or more pieces of the variable length code data, and output the recognized zero run information and the recognized additional bit information to the frequency conversion circuitry,
when the corresponding piece of the one or more pieces of the variable length code data is not the variable length code data targeted for the predetermined process, perform a process to discard the corresponding and subsequent pieces of the variable length code data in the one or more pieces of the variable length code data, and then send, to the input control circuitry, a signal for sending data subsequent to the variable length code data having been through the recognition process, and
sequentially process the plurality of pieces of the variable length code data, and apply a more strict restriction on a piece of the variable length code data located more backward in the plurality of pieces of the variable length code data with regard to the variable length code data targeted for the predetermined process.

* * * * *